United States Patent
Nagata

(10) Patent No.: US 9,232,649 B2
(45) Date of Patent: Jan. 5, 2016

(54) ADHESIVELESS COPPER CLAD LAMINATES AND PRINTED CIRCUIT BOARD HAVING ADHESIVELESS COPPER CLAD LAMINATES AS BASE MATERIAL

(71) Applicant: Sumitomo Metal Mining Co., Ltd., Tokyo (JP)

(72) Inventor: Junichi Nagata, Niihama (JP)

(73) Assignee: Sumitomo Metal Mining Co., Ltd. (JP)

( * ) Notice: Subject to any disclaimer, the term of this patent is extended or adjusted under 35 U.S.C. 154(b) by 0 days.

(21) Appl. No.: 14/048,450

(22) Filed: Oct. 8, 2013

(65) Prior Publication Data
US 2014/0102773 A1 Apr. 17, 2014

(30) Foreign Application Priority Data
Oct. 16, 2012 (JP) ................. 2012-229180

(51) Int. Cl.
*H05K 1/03* (2006.01)
*H05K 3/02* (2006.01)
*H05K 1/05* (2006.01)
*H05K 3/10* (2006.01)
(Continued)

(52) U.S. Cl.
CPC ............. *H05K 1/056* (2013.01); *H05K 1/0313* (2013.01); *H05K 3/022* (2013.01); *H05K 3/108* (2013.01); *H05K 3/388* (2013.01); *H05K 1/0393* (2013.01); *H05K 3/06* (2013.01); *H05K 2201/0154* (2013.01); *H05K 2201/0317* (2013.01); *Y10T 428/12569* (2015.01)

(58) Field of Classification Search
CPC ....... H05K 1/056; H05K 3/108; H05K 3/388; H05K 1/0393; H05K 2201/0317; H05K 2201/0154; H05K 1/0284; H05K 1/0313; H05K 1/119; H05K 3/032; H05K 3/022; H05K 3/06; Y10T 428/12569
USPC .......... 174/250–268; 428/615, 621, 671, 674, 428/618, 636, 675, 209, 901
See application file for complete search history.

(56) References Cited

U.S. PATENT DOCUMENTS 4,894,124 A * 1/1990 Walsh et al. ................. 205/167
6,171,714 B1 * 1/2001 Bergkessel et al. ........... 428/618
(Continued)

FOREIGN PATENT DOCUMENTS

JP 06-132628 5/1994
JP 08-139448 5/1996
(Continued)

*Primary Examiner* — Ishwarbhai B Patel
(74) *Attorney, Agent, or Firm* — Gerald E. Hespos; Michael J. Porco; Matthew T. Hespos

(57) ABSTRACT

Adhesiveless copper clad laminates obtained by metallizing excellent in wiring microfabrication ability in processing by semi-additive method, and a printed circuit board using the adhesiveless copper clad laminates excellent in wiring microfabrication ability as a base material are provided. The adhesiveless copper clad laminates include a base metal layer made of an alloy containing nickel and formed on at least one surface of an insulating film without using an adhesive in between, a thin copper layer formed on a front surface of the base metal layer by dry plating, and a copper plating film formed on a front surface of the thin copper layer by electroplating. The copper plating film contains 10 mass ppm to 150 mass ppm of sulfur in a depth range of at least 0.4 μm from the front surface of the copper plating film in a direction toward the insulating film.

10 Claims, 3 Drawing Sheets

(51) Int. Cl.
*H05K 3/38* (2006.01)
*H05K 3/06* (2006.01)

(56) References Cited

U.S. PATENT DOCUMENTS

| 6,759,599 | B2* | 7/2004 | Tatoh et al. | 174/261 |
| 8,506,788 | B2* | 8/2013 | Wang et al. | 205/297 |
| 2008/0102305 | A1* | 5/2008 | Nagata et al. | 428/626 |
| 2009/0092789 | A1 | 4/2009 | Tsuchida et al. | |
| 2010/0084275 | A1 | 4/2010 | Hanafusa | |
| 2012/0031656 | A1 | 2/2012 | Oka et al. | |
| 2012/0189811 | A1 | 7/2012 | Hanafusa | |
| 2012/0205804 | A1* | 8/2012 | McFeely et al. | 257/751 |
| 2014/0166495 | A1 | 6/2014 | Oka et al. | |

FOREIGN PATENT DOCUMENTS

| JP | 2006278950 | 10/2006 |
| JP | 2007123622 | 5/2007 |
| JP | 2011014721 | 1/2011 |
| WO | 2007/039992 | 4/2007 |
| WO | 2008/126522 | 10/2008 |

* cited by examiner

ADHESIVELESS COPPER CLAD LAMINATES AND PRINTED CIRCUIT BOARD HAVING ADHESIVELESS COPPER CLAD LAMINATES AS BASE MATERIAL

CROSS REFERENCE TO RELATED APPLICATIONS

The present application claims priority to Japanese Patent Application No. 2012-229180 filed on Oct. 16, 2012, the entire contents of which are incorporated by reference herein.

BACKGROUND

Field of the Invention

The present invention relates to semi-additive adhesiveless copper clad laminates and, more specifically, to adhesiveless copper clad laminates in which a wiring pattern can be directly formed on an insulating film by semi-additive process without using an adhesive.

Furthermore, the present invention relates to a printed circuit board that is manufactured by semi-additive process and has the adhesiveless copper clad laminates as a base material.

In general, substrates for use in fabricating flexible printed circuit boards are broadly classified into adhesive copper clad laminates with a copper foil for serving as a conductor layer bonded onto an insulating film using an adhesive (for example, refer to Japanese Unexamined Patent Application Publication No. H06-132628), and adhesiveless copper clad laminates with a copper coating layer for serving as a conductor layer formed directly on an insulating film by dry plating or wet plating without using an adhesive in between.

Here, when adhesive copper clad laminates are used, by forming a desired wiring pattern on a substrate by subtractive process, an adhesive flexible printed circuit board can be manufactured. Also, when adhesiveless copper clad laminate are used, by forming a desired pattern on a substrate by subtractive process or semi-additive process, an adhesiveless flexible printed circuit board can be manufactured. Conventionally, however, the use of such adhesive copper clad laminates has been mainstream, because of ease of manufacturability at low cost.

FIG. 3 shows a schematic diagram of a process for manufacturing a wiring pattern by subtractive process using adhesiveless copper clad laminates. In the subtractive process depicted in FIG. 3, the adhesiveless copper clad laminates are used as a substrate, which is formed of a thin base metal layer 2 provided on an insulating film 1 by dry plating and a copper coating layer 3 provided on the base metal layer and having a film thickness serving as a wiring, as depicted in (0) of FIG. 3. A resist layer 5 is then provided at a position to be a wiring on a front surface of the copper coating layer 3 of the adhesiveless copper clad laminates, as depicted in (1) of FIG. 3. Next, as depicted in (2) of FIG. 3, openings 5a are provided on the resist layer 5, and unwanted portions of the copper coating layer 3 and the base metal layer 2 exposed from the openings 5a are removed by etching or the like, as depicted in (3) of FIG. 3. Finally, as depicted in (4) of FIG. 3, remaining parts of the resist layer 5 are removed, thereby forming a printed circuit board.

Meanwhile, with size reduction of electronic devices in recent years, higher density has been demanded also for the flexible circuit substrate, and its wiring pitch (wiring width/space width) is getting narrower than ever.

However, in manufacturing adhesive copper clad laminates, when a copper coating layer formed on an insulating film as a substrate is etched according to a desired wiring pattern to form wiring parts in order to manufacture a printed circuit board, so-called side etching occurs, where side surfaces of the wiring parts are etched, and thus the wiring parts each tend to have a trapezoidal sectional shape spreading downward and sideward. Therefore, if etching is performed to the extent that electrical insulation properties are ensured between wiring parts, the wiring pitch is too wide. For this reason, as long as such adhesive copper clad laminates in which a copper foil having a conventionally-used thickness of 35 μm is laminated on an insulating film with an adhesive is used, narrowing the pitch of the wiring parts on the printed circuit board has a limit.

Therefore, in place of the conventional substrate formed by laminating the copper foil having the thickness of 35 μm, a substrate formed by laminating a thin copper foil having a thickness equal to or thinner than 18 μm has been used so as to decrease the width spreading downward and sideward due to side etching, and thereby narrowing the pitch of the wiring parts on the printed circuit board.

However, such a thin copper foil as described above has small low stiffness and low handling ability. To address this problem, a method has been adopted such that, after a reinforcing material such as an aluminum carrier is temporarily laminated on a copper foil to increase stiffness, the copper foil and a polyimide film are laminated to remove the aluminum carrier. However, this method disadvantageously takes time and trouble and has poor operability and productivity.

Moreover, such a thin copper foil as described above has further problems in manufacturing technology, such as unevenness in film thickness and an increase of defects in the coating film due to the occurrence of a pin hole or crack. As the copper foil becomes thinner, manufacture of the copper foil itself becomes difficult and manufacturing price is increased, resulting in a loss of a cost merit of an adhesive flexible printed circuit board.

Furthermore, in recent times, demands have been increasing for a printed circuit board having a narrow width and narrow pitch such that a copper foil having a thickness equal to or lower than a little over 10 μm or on the order of several tens of μm has to be used for manufacture. Therefore, the printed circuit board using the adhesive copper clad laminates has not only a technical problem as described above but also a problem in manufacturing cost.

Under these circumstances, a flexible printed circuit board using adhesiveless copper clad laminates where a copper coating layer can be directly formed on an insulating film without using an adhesive in between has attracted attention.

In such adhesiveless copper clad laminates, the copper coating layer is directly formed on the insulating film without an adhesive, and therefore the adhesiveless copper clad laminates have advantages not only that the thickness of the substrate itself can be made thinner, but the thickness of the copper coating layer to be attached thereto can also be adjusted to any thickness.

In manufacturing adhesiveless copper clad laminates, a copper electroplating method is normally adopted as a means for forming a copper coating layer having a uniform thickness on an insulating film. In order to carry out the copper electroplating, generally, conductivity is given to the whole surface by forming a thin base metal layer on the insulating film on which a copper electroplating layer is to be applied, and then the copper electroplating processing is applied thereon (for example, refer to Japanese Unexamined Patent Application Publication No. H08-139448).

As for a method of forming a wiring pattern, semi-additive process has been suggested in order to solve the problems of the subtractive process described above. An example of a method of manufacturing a printed circuit board by semi-additive process is disclosed in Japanese Unexamined Patent Application Publication No. 2006-278950.

FIG. 2 shows a schematic diagram of a process for manufacturing a printed circuit board by semi-additive process using adhesiveless copper clad laminates. In the semi-additive process depicted in FIG. 2, the adhesiveless copper clad laminates are used as a substrate, which is formed of a thin base metal layer 2 provided on an insulating film 1 by dry plating and a thin copper coating layer 3 provided on the base metal layer, as depicted in (0) of FIG. 2. A resist layer 5 is formed on a front surface of the copper coating layer 3 of the substrate depicted in (1) of FIG. 2, and then an openings 5a are provided on the resist layer 5 at desired positions where wiring patterns are to be formed on the copper coating layer 3 as depicted in (2) of FIG. 2. Then as depicted in (3) of FIG. 2, copper electroplating is performed to exposed portions of the copper coating layer 3 from the openings 5a, the exposed portions being taken as a cathode, so as to form wiring parts 4 having a desired film thickness. Next, as depicted in (4) of FIG. 2, remaining parts of the resist layer 5 are removed, and finally the metal layers (the base metal layer and the copper coating layer) on the front surface of the substrate except wiring parts 4 are removed by flash etching or the like as depicted in (5) of FIG. 2, thereby completing a printed circuit board.

In this semi-additive process, unlike the subtractive process, forming a wiring pattern is not performed by etch removal of the unwanted portion of the copper coating layer. Therefore it is not necessary to pay careful attention to side etching of the wiring. For this reason, the semi-additive process is suitable for narrow-pitched wiring, but has some problems.

For example, when a dry film resist is used in place of a liquid resist in order to form of the resist layer 5 depicted in (1) of FIG. 2, it is difficult to completely adhere the film to the front surface of the copper coating film. Therefore, the top front surface of the copper coating layer is provided with fine asperities with a chemical polishing liquid to enhance adhesiveness due to an anchor effect. For example, however, there is a chemical polishing liquid which causes excessive asperities depending on the state of the copper coating layer, thereby contrarily degrading adhesiveness.

Moreover, when the metal layers on the front surface of the substrate except the wiring parts are removed by flash etching as depicted in (5) of FIG. 2, so-called undercut may occur, where a bottom width (W2) of wiring is smaller than a wiring pattern width (W1) of the wiring.

Due to the presence of such undercut, the following problems occur that an adhesive width to the insulating film becomes smaller than a predetermined wiring pattern width, and thereby, when the ratio of the adhesive width is decreased more than necessary, it is disadvantageously impossible to obtain a sufficient wiring adhesive strength. Note that definitions of the bottom width (W2) of wiring and the wiring pattern width (W1) are described in FIG. 1A and FIG. 1B.

Still further, regarding the undercut, if a ratio of an undercut amount (W1−W2)/2 with respect to the width W1 of the wiring pattern exceeds 7.5%, the decrease in adhesive strength becomes a serious problem, which is disclosed in Japanese Unexamined Patent Application Publication No. 2007-123622.

SUMMARY OF THE INVENTION

In view of these circumstances, the present invention is to provide adhesiveless copper clad laminates obtained by a metalizing process that is excellent in wiring microfabrication ability, in processing by semi-additive method.

A first aspect of the present invention provides adhesiveless copper clad laminates including a base metal layer made of an alloy containing nickel and formed on at least one surface of an insulating film without using an adhesive in between, a thin copper layer formed on a front surface of the base metal layer by dry plating, and a copper plating film formed on a front surface of the thin copper layer by electroplating, and the copper plating film contains 10 mass ppm to 150 mass ppm of sulfur in a depth range of at least 0.4 μm from the front surface of the copper plating film in a direction toward the insulating film.

A second aspect of the present invention provides the adhesiveless copper clad laminates according to the first aspect, wherein a total film thickness of a copper coating layer including the thin copper layer formed on the base metal layer by dry plating and the copper plating film formed on the thin copper layer by electroplating is 0.5 μm to 4 μm.

A third aspect of the present invention provides the adhesiveless copper clad laminates according to the first or second aspect, wherein the insulating film is a resin film selected from a polyimide film, a polyamide film, a polyester film, a polytetrafluoroethylene film, a polyphenylenesulfide film, a polyethylenenaphthalate film, and a liquid crystal polymer film.

A fourth aspect of the present invention provides a printed circuit board wherein a wiring pattern is formed by semi-additive process using, for energization, a laminated body of metal films formed of the base metal layer, the thin copper layer, and the copper plating film that are formed, in sequence, on the insulating film of the adhesiveless copper clad laminates according to any one of the first to third aspects of the present invention.

A fifth aspect of the present invention provides the printed circuit board according to the fourth aspect of the present invention, in which the wiring pattern is formed by semi-additive process using, for energization, the laminated body of the metal films including the base metal layer, the thin copper layer, and the copper plating film that are formed, in sequence, on the insulating film of the adhesiveless copper clad laminates, and then a portion of the laminated body of the metal films on the surface of the adhesiveless copper clad laminates which portion has not been used in wiring pattern is removed, a bottom width (W2) of the wiring pattern and a width (W1) of the wiring pattern have a relation represented by the following equation:

Equation 1:

$$(W1-W2)/2W1 \le 0.075. \tag{1}$$

By forming a wiring by semi-additive process using adhesiveless copper clad laminates of the present invention as a substrate, an adhesion state between the substrate and the dry film resist is improved, and as a result, a printed circuit board with less resist defects can be obtained.

Furthermore, since undercut is prevented in the formed wiring, a flexible printed circuit board can be efficiently obtained where exfoliation of the wiring is difficult to occur even with microfabricated wiring, and an industrially remarkable effect can be achieved.

DETAILED DESCRIPTION OF THE PREFERRED EMBODIMENTS

Figures 1A, 1B:
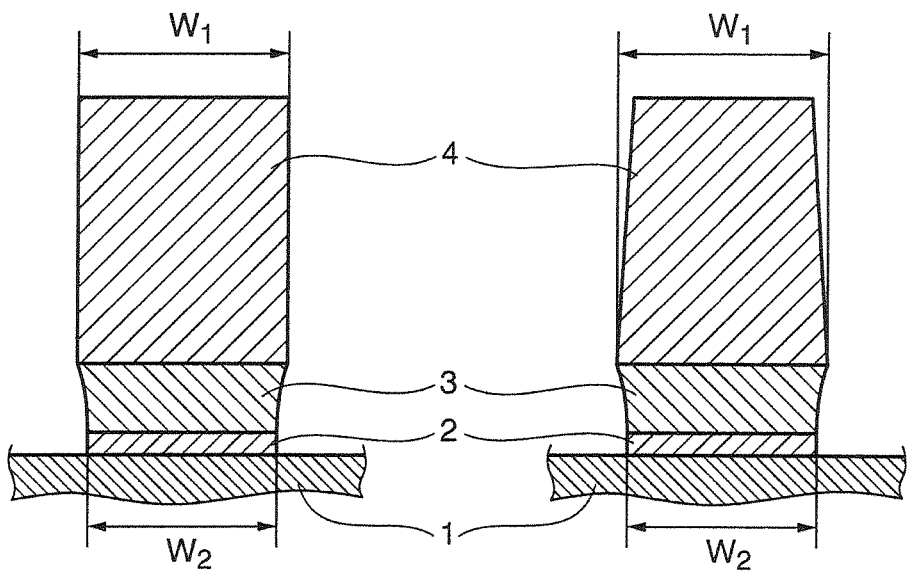
FIG. 1A and FIG. 1B are sectional views of a printed circuit board for defining undercut, FIG. 1A depicting the case where flash etching is normally made and a wiring 4 having a rectangular section is formed, and FIG. 1B depicting the case where a wiring 4 having a trapezoidal section is formed.
Figure 2:
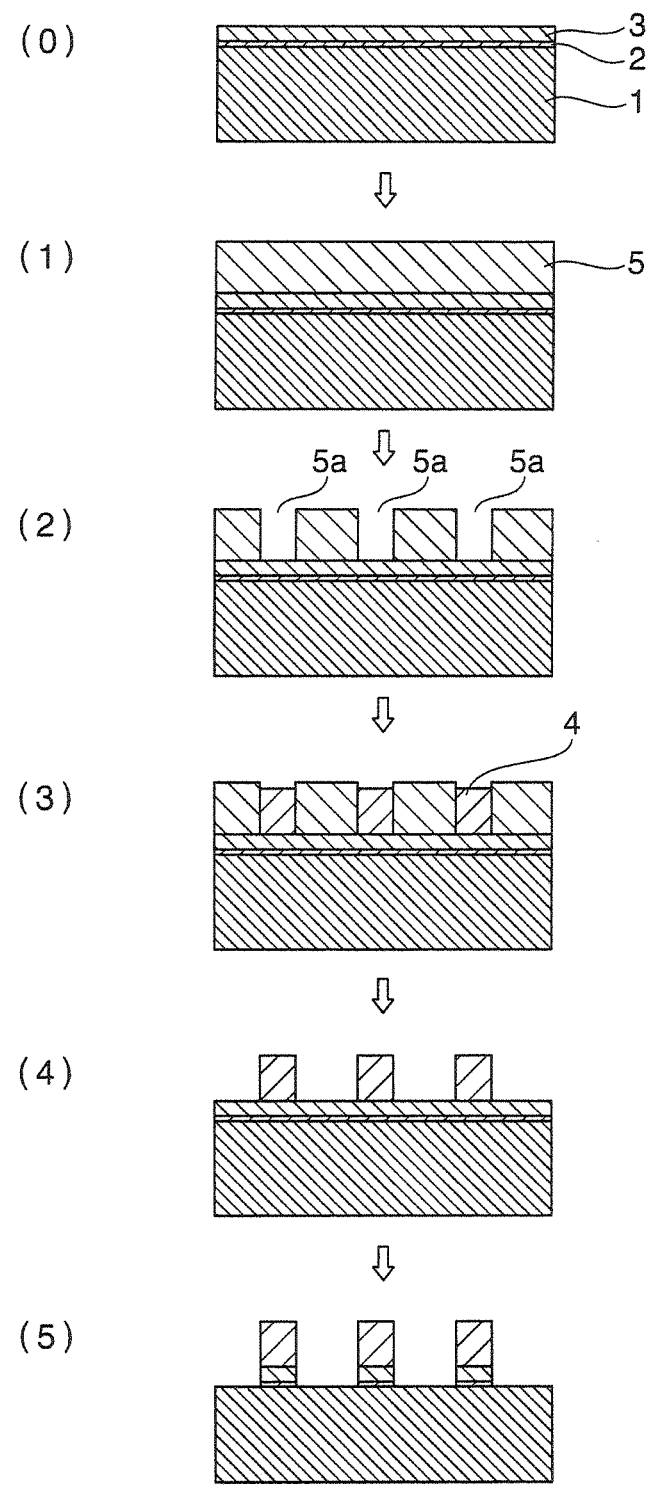
FIG. 2 is a schematic diagram of a process for manufacturing a printed circuit board by semi-additive process.
Figure 3:
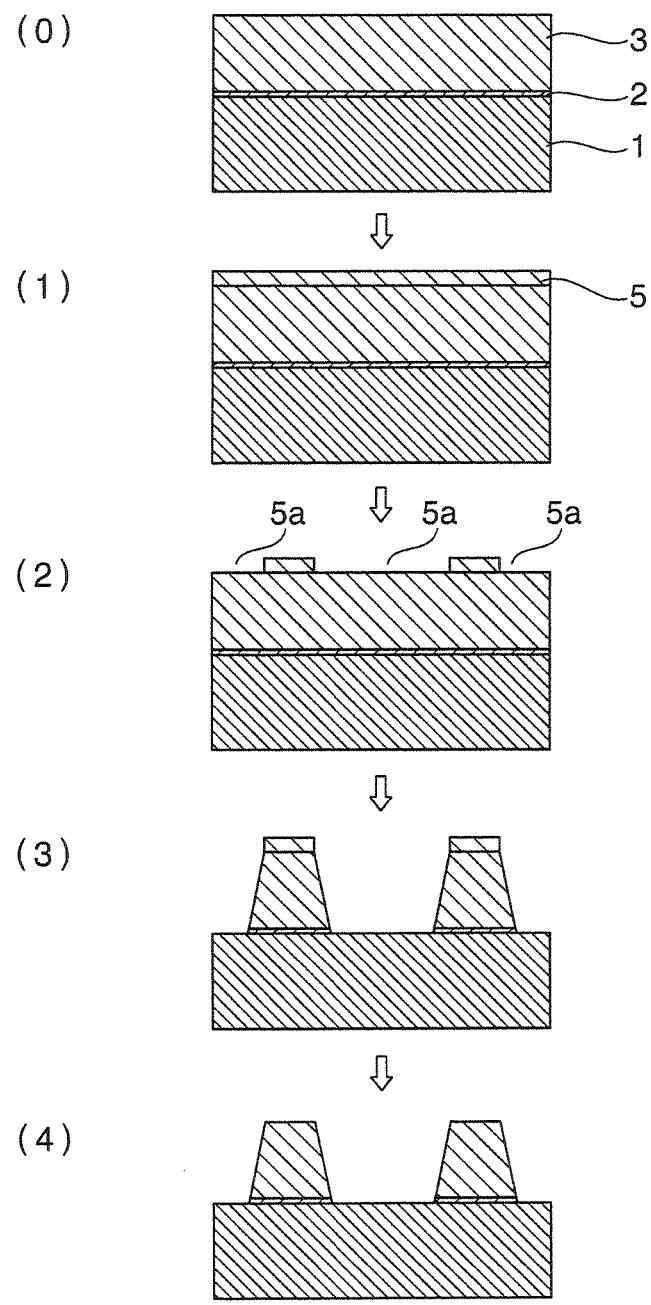
FIG. 3 is a schematic diagram of a process for manufacturing a printed circuit board by subtractive process.

The adhesiveless copper clad laminates of the present invention includes a base metal layer made of an alloy containing nickel and formed on at least one surface of an insulating film without using an adhesive in between, a thin copper layer formed on a front surface of the base metal layer by dry plating, and a copper plating film formed on a front surface of the thin copper layer by electroplating, and the copper plating film contains 10 mass ppm to 150 mass ppm of sulfur in a depth range of 0.4 μm from the front surface of the copper plating film.

(1) Insulating Film

As an insulating film for use in a substrate, a resin film selected from a polyimide film, a polyamide film, a polyester film, a polytetrafluoroethylene film, a polyphenylenesulfide film, a polyethylenenaphthalate film, and a liquid crystal polymer film may be used. A polyimide film is preferable in view of application also for the purpose where a connection at high temperatures such as solder reflow is required.

Also, the film described above preferably has a film thickness of 8 μm to 75 μm for use.

(2) Base Metal Layer

As a base metal layer for use in a substrate, an alloy containing nickel may be used.

Furthermore, for the purpose of improving anti-corrosion characteristics, another metal element may be added, such as, preferably, chromium, vanadium, titanium, molybdenum, cobalt, or tungsten.

Dry plating for use in formation of the base metal layer is not particularly limited, and any one of vacuum deposition, sputtering, and ion plating is preferable and, more preferably, sputtering is used.

For example, when a winding-type sputtering device is used to from a base metal layer, an alloy target having a desired composition of the base metal layer is inserted in a sputtering cathode, an insulating film is set, and then Ar gas is introduced to the device after the inside of the device is evacuated, thereby keeping the inside of the device at approximately 0.13 Pa to 1.3 Pa. In this state, while the insulating film is being transported from a feed roll at a speed on the order of 1 m to 20 m per minute, electric power is supplied from a sputtering direct-current power supply connected to the cathode for sputtering discharge, thereby successively forming a desired base metal layer on the insulating film.

Prior to dry plating, any various known processing may be performed on the front surface of the insulating film, such as plasma processing, ultraviolet radiation processing, corona discharge processing, ion beam processing, and fluorine gas processing.

The base metal layer preferably has a film thickness of 3 nm to 50 nm.

If the film thickness of the base metal layer is thinner than 3 nm, when the metal coating layer except wiring parts is removed by flash etching or the like to eventually fabricate wirings, etching liquid may corrode the metal coating film to be immersed between the polyimide film and the metal coating layer to cause the wiring to be floated. On the other hand, if the film thickness of the base metal layer excesses 50 nm, when wirings are eventually fabricated by flash etching or the like, a thin metal film may be not completely removed and left between wirings as a residue, thereby possibly causing an insulation failure between wirings.

(3) Thin Copper Layer

Similarly to the formation of the base metal layer, the sputtering device is used with a copper target being inserted into the sputtering cathode, and a thin copper layer can be formed by dry plating. Here, it is preferable to continuously form the base metal layer and the thin copper layer in the same vacuum chamber.

The thin copper layer preferably has a film thickness of 10 nm to 0.3 μm. That is, the film thickness thinner than 10 nm is not preferable because conductivity is low and a sufficient electrical power feeding amount cannot be ensured at the time of electroplating. The film thickness exceeding 0.3 μm is not preferable either because productivity at the time of film formation is decreased.

(4) Copper Plating Film

A copper plating film is laminated by electroplating on the thin copper layer obtained by dry plating, and the copper plating film has sulfur of 10 mass ppm to 150 mass ppm in a depth range of at least 0.4 μm from the front surface to the direction toward the insulating film.

With the sulfur concentration at and near the front surface of the copper plating film being in the range described above, the crystal particle diameter at and near the front surface can be made suitable for flash etching in the semi-additive process.

If the sulfur has a concentration smaller than 10 mass ppm, coarse crystals less prone to etching are increased on the copper plating film, and flash etching time after formation of wiring pattern is increased, thereby causing etching to proceed in a side direction of the wiring pattern and making the occurrence of undercut significant.

On the other hand, if the sulfur concentration exceeds 150 mass ppm, excessive asperities are generated in chemical polishing before a dry film resist is adhered, thereby decreasing adhesive power between the copper plating layer and the resist layer to cause peeling of the resist layer.

Here, a method for electroplating is not particularly limited, and various conditions under a normal method can be adopted. More specifically, by controlling the concentration of an organic compound having sulfur atoms in a copper plating solution, currency density, and transportation speed, a copper plating film having the sulfur concentration described above can be formed.

The content of the organic compound having sulfur atoms in the copper plating solution is preferably set at 2 mass ppm to 25 mass ppm.

The reason for the above is as follows. The amount of sulfur atoms taken into the copper plating film is increased or decreased according to the concentration of the organic compound having the sulfur atoms. If the amount of sulfur atoms is smaller than 2 mass ppm or exceeds 25 mass ppm, it is not possible to obtain a copper plating film containing sulfur of 10 mass ppm to 150 mass ppm in a depth range of at least 0.4 μm from the front surface to the direction of the insulating film even if the current density and transportation speed are adjusted.

Those that can be used as the organic compound having sulfur atoms have already been described in various publications and printed matters, for example, 3-(benzothiazolyl-2-thio)propylsulfonate and its sodium salt, 3-mercaptopropane-1-sulfonate and its sodium salt, ethylene dithiodipropyl sulfonate and its sodium salt, bis(p-sulfophenyl)disulfide and its 2 sodium salt, bis(4-sulfobutyl)disulfide and its 2 sodium salt, bis(3-sulfo-2-hydroxypropyl)disulfide and its 2 sodium salt, bis(3-sulfopropyl)disulfide and its 2 sodium salt, bis(2-sulfopropyl)disulfide and its 2 sodium salt, methyl-(w-sulfopropyl)-sulfide and its 2 sodium salt, methyl-(w-sulfopropyl)-trisulfide and its 2 sodium salt, thioglycolic acid, thiophosphate-ortho-ethyl-bis(w-sulfopropyl)-ester and its 2 sodium salt, thiophosphate-tris(w-sulfopropyl)-ester and its 2 sodium salt and thiophosphate-tris(w-sulfopropyl)-ester and its 3 sodium salt, The copper coating layer including the thin copper layer formed on the base metal layer by dry plating and the copper plating film formed on the thin copper layer by electroplating preferably has a film thickness of 0.5 μm to 4 μm.

The film thickness thinner than 0.5 μm is not preferable because electric power feeding in forming wirings by the semi-additive process is difficult. The film thickness thicker than 4 μm is not preferable either because the flash etching time is increased to decrease productivity.

(5) Flexible Printed Circuit Board

By individually forming a wiring pattern on at least one surface of the adhesiveless copper clad laminates, a flexible printed circuit board can be obtained. Also, a via hole for interlayer connection can be formed at a predetermined position of the substrate and used for various purposes.

As a more specific wiring pattern forming method, the following (A) to (C) can be used, for example:

(A) A high-density wiring pattern is individually formed on at least one surface of the adhesiveless copper clad laminates;

(B) As required, on the adhesiveless copper clad laminates having the wiring layer formed thereon, a via hole penetrating through the wiring layer and the adhesiveless copper clad laminates is formed; and (C) In some cases, the via hole is filled with a conductive substance for making the inside of the hole conductive.

As a method for forming the wiring pattern, the conventionally-known semi-additive process is used.

For example, adhesiveless copper clad laminates having a base metal layer and a copper coating layer sequentially formed on at least one surface is prepared, and the front surface of the copper coating layer is chemically polished. Then, a dry film resist is laminated thereon to form a photosensitive resist film. Then, exposure and development are performed for patterning. Next, a copper-plated layer is formed by copper electroplating on a lamination body of the metal film formed of the base metal layer and the copper coating layer for use in energization and exposed from the obtained circuit pattern.

Furthermore, after the circuit pattern is peeled and removed, the copper coating layer used for energization and exposed to the surroundings of the copper-plated layer is dissolved and removed by flash etching. Finally, a portion of the base metal layer exposed to the surroundings of the copper-plated layer is dissolved and removed.

Then, as required, metal plating such as tin plating is performed on the front surface of the wiring pattern to form a solder resist or the like, thereby obtaining a flexible printed circuit board.

Here, a definition regarding a ratio of an undercut amount used in the present invention are described. FIG. 1A and FIG. 1B are sectional views of a printed circuit board for defining undercut, FIG. 1A depicting the case where flash etching is normally made and thus a wiring 4 having a rectangular section is formed, and FIG. 1B depicting the case where a wiring 4 having a trapezoidal section is formed.

If the time in flash etching is increased, undercut occurs where the bottom width of the wiring is smaller than the wiring pattern width. As depicted in FIG. 1A, the bottom width of the wiring is a minimum width (W2) of the copper coating layer. As depicted in FIG. 1B, the section of the copper-plated layer formed by the semi-additive process may be formed into a trapezoidal shape spreading downward and sideward. Therefore, the width of the wiring pattern is set as a maximum width (W1) above the minimum width of the copper coating layer.

An undercut amount is represented by (W1−W2)/2. As disclosed in Japanese Unexamined Patent Application Publication No. 2007-123622, if the ratio with respect to the wiring pattern width W1 exceeds 7.5%, a serious decrease in adhesive strength occurs. Therefore, an undercut amount ratio of (W1−W2)/2W1 is desirably equal to or lower than 0.075.

Examples of a suitable chemical solution for use in the flash etching described above include sulfuric acid, hydrogen peroxide, hydrochloric acid, cupric chloride, ferric chloride, and a combination thereof.

Here, to increase the density of the wiring more, it is preferable to prepare adhesiveless copper clad laminates having metal layers on both surfaces thereof and perform patterning on the both surfaces to from wiring patterns on both surfaces of the substrate.

As to how many wiring regions the entire wiring pattern is to be divided into, it depends on, for example, the distribution of wiring density of the wiring pattern. For example, the wiring pattern is divided into a high-density wiring region having a wiring width and a wiring space each being equal to or smaller than 50 μm and other wiring regions, and the size of the printed circuit board to be divided is set to be approximately 10 mm to 65 mm for division as appropriate, in consideration of a difference in thermal expansion with respect to the printed substrate, convenience in handling, etc.

As the method of forming a via hole, any conventionally known method can be used.

For example, at a predetermined position of a wiring pattern, a via hole penetrating through the wiring pattern and the adhesiveless copper clad laminates is formed by laser processing or the like.

The diameter of the via hole is preferably set to be small within a range without any trouble in energization of the inside of the hole, and is normally set to be equal to or smaller than 100 μm and preferably be equal to or smaller than 50 μm. Note that the inside of the via hole is filled with a conductive metal such as copper by plating, vapor deposition, sputtering, or the like, or a conductive paste is pressed into the inside of the via hole by using a mask having a predetermined opening hole pattern and then dried for energization inside the hole to perform interlayer electrical connection.

Examples of a conductive metal for filling include copper, gold, and nickel.

EXAMPLES

In the following, the present invention is described further in detail by using examples and comparative examples of the present invention. However, the present invention is never limited by these examples.

A method of measuring a sulfur concentration and a method of evaluating a centerline average roughness (Ra) used in the examples and comparative examples were performed by the following measuring method and evaluating method.

(1) Measurement of Sulfur Concentration

A sulfur content in the copper plating film was measured by a Dynamic-Secondary Ion Mass Spectroscopy (D-SIMS).

Note that an ims5f dynamic secondary ion mass spectroscopy (manufactured by CAMECA SAS.) was used as the D-SIMS.

Measurements were performed under primary ion condition: Cs+, 14.5 keV, and 30 nA; irradiation region: 150 μm×150 μm; analysis region: ϕ60 μm; secondary ion polarity: negative [in general, when electropositive element (such as Li, B, Mg, Ti, Cr, Mn, Fe, Ni, Mo, In, or Ta) is analyzed, oxygen ions are irradiated to detect positive secondary ions and on the other hand, when electronegative element (such as H, C, O, F, Si, S, Cl, As Te, or Au) is analyzed, cesium ions are irradiated to detect negative secondary ions, thereby allowing sensitive measurement]; degree of vacuum in a sample chamber: $8.0 \times 10^{-8}$ Pa; and sputtering speed: approximately 22 angstroms/sec (an average sputtering speed up to the analyzed depth was found based on the copper thickness and sputtering time and, by using this value, sputtering time for each sample was converted to a depth).

(2) Measurement of Centerline Average Roughness (Ra)

The surface of the obtained substrate was chemically polished with clean etch CPE-750 (manufactured by Mitsubishi Gas Chemical Company, Inc.), and a centerline average roughness (Ra) of the surface was measured by an optical profiler (NewView 6200 manufactured by Zygo Corporation).

Example 1

As a base metal layer, on one side of a polyimide film having a thickness of 35 μm (product name "UPILEX (registered trademark) 35SGA" manufactured by Ube Industries, Ltd.), a 20 weight % Cr—Ni alloy base metal layer having a thickness of 20 nm was formed by direct current sputtering using a 20 weight % Cr—Ni alloy target (manufactured by Sumitomo Metal Mining Co., Ltd). Subsequently, a film was formed thereon as a thin copper layer so as to have a thickness of 200 nm, by direct current sputtering using a Cu target (manufactured by Sumitomo Metal Mining Co., Ltd). Then, a copper plating layer having a thickness of 0.8 μm was laminated on the thin copper layer by electroplating, thereby forming a copper coating layer including the thin copper layer and the copper plating layer having a thickness of 1 μm.

A copper plating solution used was a copper sulfate solution having a temperature of 27 degrees Celsius and a pH equal to or lower than 1, and containing SPS (Bis(3-sulforpropyl) disulfide of 8 mass ppm as an organic compound having a sulfur atom.

The sulfur concentration in the copper plating film measured in a depth range of 0.4 μm from the front surface of the copper plating film was 60 mass ppm.

Then, a centerline average roughness (Ra) of the obtained substrate was measured according to the method of measuring the centerline average roughness (Ra) described above. The result is shown in Table 1.

Next, after a dry film resist (RY-3315 manufactured by Hitachi Chemical Co., Ltd.) was laminated on the fabricated substrate, exposure and development were performed to form a circuit pattern so that the wiring pitch was 20 μm (a line width of 10 μm and a space width of 10 μm). No peeling of the resist layer was confirmed.

Next, using a lamination body of metal films formed of the base metal layer and the copper coating layer (including the thin copper layer and the copper plating film) for energization, a copper-plated layer was formed on the exposed copper plating layer by electroplating using a solution with copper sulfate as a main component. After the formation of the copper-plated layer, aqueous sodium hydroxide solution having a concentration of 4% was used for immersion processing at a liquid temperature of 50 degrees Celsius for 120 seconds, thereby peeling and removing a portion of the circuit pattern around the copper-plated layer. Finally, the exposed copper plating layer was removed by etching using a solution containing sulfuric acid having a concentration of 10% and hydrogen peroxide having a concentration of 30% and then, the exposed base metal layer was removed by etching using a solution containing hydrochloric acid having a concentration of 10% and sulfuric acid having a concentration of 30%.

The section of the wiring was observed by SEM, and the undercut amount ratio of $(W1-W2)/2W1$ of the bottom of the wiring part was 0.03, which was smaller than those of Comparative Examples, which will be described further below.

Example 2

Adhesiveless copper clad laminates were obtained in a manner similar to that of Example 1 except that a copper coating layer having a thickness of 4 μm is laminated. The sulfur concentration in the copper plating film measured in a depth range of 0.4 μm from the front surface of the copper plating film was 10 mass ppm.

The front surface of the copper plating film was chemically polished in a manner similar to that of Example 1, and a dry film resist was laminated and then exposed for development, thereby forming a circuit pattern so that the wiring pitch was 20 μm. No peeling of the resist layer was confirmed.

Then, after wiring processing was performed in a manner similar to that of Example 1, the section of the wiring was observed by SEM, and the undercut amount ratio of $(W1-W2)/2W1$ of the bottom of the wiring part was 0.02, which was smaller than those of Comparative Examples, which will be described further below.

Example 3

Adhesiveless copper clad laminates were obtained in a manner similar to that of Example 1 except that a polyimide film having a thickness of 38 μm (product name "Kapton (registered trademark) 150EN" manufactured by DU PONT-TORAY CO., LTD.) was used as an insulating film.

The sulfur concentration in the copper plating film measured in a depth range of 0.4 μm from the front surface of the copper plating film was 60 mass ppm.

The front surface of the copper plating film was chemically polished in a manner similar to that of Example 1, and a dry film resist was laminated and then exposed for development, thereby forming a circuit pattern so that the wiring pitch was 20 μm. No peeling of the resist layer was confirmed.

Then, after wiring processing was performed in a manner similar to that of Example 1, the section of the wiring was observed by SEM, and the undercut amount ratio of $(W1-W2)/2W1$ of the bottom of the wiring part was 0.03, which was smaller than those of Comparative Examples, which will be described further below.

Example 4

Adhesiveless copper clad laminates were obtained in a manner similar to that of Example 1 except that a copper coating layer having a thickness of 0.5 μm was formed on both sides of the polyimide film.

The sulfur concentration in the copper plating film measured in a depth range of 0.4 μm from the front surface of the copper plating film was 150 mass ppm.

The front surface of the copper plating film was chemically polished in a manner similar to that of Example 1, and a dry film resist was laminated and then exposed for development, thereby forming a circuit pattern so that the wiring pitch was 20 μm. No peeling of the resist layer was confirmed.

Then, after wiring processing was performed on both sides in a manner as that of Example 1, the sections of the wirings were observed by SEM, and the undercut amount ratios of (W1−W2)/2W1 of the bottoms of the wiring parts were respectively 0.03 on both sides, which was smaller than those of Comparative Examples, which will be described further below.

Comparative Example 1

Adhesiveless copper clad laminates were obtained in a manner similar to that of Example 1 except that SPS addition to the copper plating solution was 1 mass ppm.

The sulfur concentration in the copper plating film measured in a depth range of 0.4 μm from the front surface of the copper plating film was 5 mass ppm.

The front surface of the copper plating film was chemically polished in a manner similar to that of Example 1, a dry film resist was laminated and then exposed for development, thereby forming a circuit pattern so that the wiring pitch was 20 μm. No peeling of the resist layer was confirmed.

Then, wiring processing was performed in a manner similar to that of Example 1, but it was difficult to dissolve the copper coating layer used for energization at the time of flash etching, and it took more time than the above Examples. When the section of the wiring was observed by the SEM, the undercut amount ratio of (W1−W2)/2W1 of the bottom of the wiring part was 0.1, which was larger than those of the Examples.

Comparative Example 2

Adhesiveless copper clad laminate were obtained in a manner similar to that of Example 1 except that SPS addition to the copper plating solution was 40 mass ppm.

The sulfur concentration in the copper plating film measured in a depth range of 0.4 μm from the front surface of the copper plating film was 160 mass ppm.

When the front surface of the copper plating film was chemically polished, and Ra was measured. The measurement result was significantly larger than the result of Example 1. Then, a dry film resist was laminated and then exposed for development, thereby forming a circuit pattern so that the wiring pitch was 20 μm. Peeling of the resist layer was partially confirmed.

Furthermore, after wiring processing was performed in a manner similar to that of Example 1, the section of the wiring was observed by SEM, and the undercut amount ratio of (W1−W2)/2W1 of the bottom of the wiring part was 0.05.

Comparative Example 3

Adhesiveless copper clad laminates were obtained in a manner similar to that of Example 1 except that SPS addition to the copper plating solution was 5 mass ppm and that a copper coating layer of 0.4 μm was laminated. The sulfur concentration in the copper plating film measured in a depth range of 0.4 μm from the front surface of the copper plating film was 150 mass ppm.

The front surface of the copper plating film was chemically polished in a manner similar to that of Example 1, a dry film resist was laminated and then exposed for development, thereby forming a circuit pattern so that the wiring pitch was 20 μm. No peeling of the resist layer was confirmed.

Then, wiring processing was performed in a manner similar to that of Example 1, but it was difficult to supply electric power, and therefore the current density and transportation speed were required to be decreased.

Comparative Example 4

Adhesiveless copper clad laminates were obtained in a manner similar to that of Example 1 except that SPS addition to the copper plating solution was 10 mass ppm and that a copper coating layer of 4.5 μm was laminated. However, to make the copper plating layer thicker, the transportation speed was required to be decreased.

The sulfur concentration in the copper plating film measured in a depth range of 0.4 μm from the front surface of the copper plating film was 10 mass ppm.

The front surface of the copper plating film was chemically polished in a manner similar to that of Example 1, a dry film resist was laminated and then exposed for development, thereby forming a circuit pattern so that the wiring pitch was 20 μm. No peeling of the resist layer was confirmed.

Then, wiring processing was performed in a manner similar to that of Example 1. In flash etching, it took more time than the Examples to dissolve the copper coating layer used for energization, and the transportation speed was required to be decreased.

The section of the wiring was observed by the SEM, and the undercut amount ratio of (W1−W2)/2W1 of the bottom of the wiring part was 0.05, which was larger than those of the Examples.

The results of the Examples and the Comparative examples are collectively shown in Table 1.

In Examples 1 to 4, it can be found that the surface roughness after chemical polishing is small, no peeling of the resist layer occurred, and the undercut amount ratio after flash etching is also small. On the other hand, it can be found that in Comparative Example 1 where the sulfur concentration at and near the front surface of the copper coating layer is smaller than the lower limit according to the present invention, the undercut amount ratio exceeds 0.075, which causes a serious decrease in adhesive strength. Further, it can be found that in Comparative Example 2 where the sulfur concentration at and near the front surface of the copper coating layer exceeds the upper limit according to the present invention, the surface roughness after chemical polishing is large, and peeling of the resist layer occurred.

Furthermore, it can be found that in Comparative Example 3 where the film thickness of the copper coating layer is smaller than the lower limit according to the present invention, it was difficult to feed electric power at the time of wiring processing, and the current density and transportation speed were required to be decreased. It can be found that in Comparative Example 4 where the film thickness of the copper coating layer exceeds the upper limit according to the present invention, the transportation speed was required to be decreased at the time of formation of the copper coating layer and in flash etching after wiring processing, thereby degrading productivity.

TABLE 1

| | Copper coating layer | | | | |
|---|---|---|---|---|---|
| | Film thickness [μm] | Sulfur concentration [mass ppm] | Ra of front surface after chemical polishing [nm] | Peeling of resist layer | Undercut amount ratio |
| Example 1 | 1 | 60 | 8 | No | 0.03 |
| Example 2 | 4 | 10 | 5 | No | 0.02 |
| Example 3 | 1 | 60 | 9 | No | 0.03 |
| Example 4 | 0.5 | 150 | 22 | No | 0.03 |
| Comparative Example 1 | 1 | 5 | 32 | No | 0.1 |
| Comparative Example 2 | 1 | 160 | 61 | Yes | 0.05 |
| Comparative Example 3 | 0.4 | 150 | 25 | No | — |
| Comparative Example 4 | 4.5 | 10 | 6 | No | 0.05 |

What is claimed is:

1. Adhesiveless copper clad laminates comprising
a base metal layer made of an alloy containing nickel and formed on at least one surface of an insulating film without using an adhesive in between,
a thin copper layer formed on a front surface of the base metal layer by dry plating, and
a copper plating film formed on a front surface of the thin copper layer by electroplating,
wherein the copper plating film contains 10 mass ppm to 150 mass ppm of sulfur from the front surface of the copper plating film to a depth of 0.4 μm in a direction toward the insulating film.

2. The adhesiveless copper clad laminates of claim 1, wherein
a total film thickness of a copper coating layer comprising the thin copper layer formed on the base metal layer by dry plating and the copper plating film formed on the thin copper layer by electroplating is 0.5 μm to 4 μm.

3. The adhesiveless copper clad laminates of claim 2, wherein
the insulating film is a resin film selected from a polyimide film, a polyamide film, a polyester film, a polytetrafluoroethylene film, a polyphenylenesulfide film, a polyethylenenaphthalate film, and a liquid crystal polymer film.

4. The adhesiveless copper clad laminates of claim 1, wherein
the insulating film is a resin film selected from a polyimide film, a polyamide film, a polyester film, a polytetrafluoroethylene film, a polyphenylenesulfide film, a polyethylenenaphthalate film, and a liquid crystal polymer film.

5. A printed circuit board wherein
a wiring pattern is formed by semi-additive process using, for energization, a laminated body of metal films formed of the base metal layer, the thin copper layer, and the copper plating film that are formed, in sequence, on the insulating film of the adhesiveless copper clad laminates of claim 1.

6. The printed circuit board of claim 5, in which the wiring pattern is formed by semi-additive process using, for energization, the laminated body of the metal films formed of the base metal layer, the thin copper layer, and the copper plating film that are formed, in sequence, on the insulating film of the adhesiveless copper clad laminates, and then a portion of the laminated body of the metal films on the surface of the adhesiveless copper clad laminates which portion has not been used in wiring pattern is removed,
wherein a bottom width ($W_2$) of the wiring pattern and a width ($W_1$) of the wiring pattern have a relation represented by the following equation:

$$(W_1-W_2)/2W_1 \leq 0.075.$$

7. A printed circuit board wherein
a wiring pattern is formed by semi-additive process using, for energization, a laminated body of metal films formed of the base metal layer, the thin copper layer, and the copper plating film that are formed, in sequence, on the insulating film of the adhesiveless copper clad laminates of claim 2.

8. The printed circuit board of claim 7, in which the wiring pattern is formed by semi-additive process using, for energization, the laminated body of the metal films formed of the base metal layer, the thin copper layer, and the copper plating film that are formed, in sequence, on the insulating film of the adhesiveless copper clad laminates, and then a portion of the laminated body of the metal films on the surface of the adhesiveless copper clad laminates which portion has not been used in wiring pattern is removed,
wherein a bottom width ($W_2$) of the wiring pattern and a width ($W_1$) of the wiring pattern have a relation represented by the following equation:

$$(W_1-W_2)/2W_1 \leq 0.075.$$

9. A printed circuit board wherein
a wiring pattern is formed by semi-additive process using, for energization, a laminated body of metal films formed of the base metal layer, the thin copper layer, and the copper plating film that are formed, in sequence, on the insulating film of the adhesiveless copper clad laminates of claim 3.

10. The printed circuit board of claim 9, in which the wiring pattern is formed by semi-additive process using, for energization, the laminated body of the metal films formed of the base metal layer, the thin copper layer, and the copper plating film that are formed, in sequence, on the insulating film of the adhesiveless copper clad laminates, and then a portion of the laminated body of the metal films on the surface of the adhesiveless copper clad laminates which portion has not been used in wiring pattern is removed,
wherein a bottom width ($W_2$) of the wiring pattern and a width ($W_1$) of the wiring pattern have a relation represented by the following equation:

$$(W_1-W_2)/2W_1 \leq 0.075.$$

* * * * *